United States Patent [19]

Kunitsugu

[11] Patent Number: 5,368,992
[45] Date of Patent: Nov. 29, 1994

[54] METHOD OF PRODUCING DIFFRACTION GRATING

[75] Inventor: Yasuhiro Kunitsugu, Itami, Japan

[73] Assignee: Mitsubishi Denki Kabushiki Kaisha, Tokyo, Japan

[21] Appl. No.: 34,785

[22] Filed: Mar. 19, 1993

[30] Foreign Application Priority Data

Apr. 23, 1992 [JP] Japan ................... 4-131768

[51] Int. Cl.⁵ ............................................. G03C 5/00
[52] U.S. Cl. ................................ 430/321; 430/324; 359/575; 156/654; 156/659.1; 156/661.1
[58] Field of Search ............... 430/321, 324; 359/575; 156/633, 654, 659.1, 661.1

[56] References Cited

U.S. PATENT DOCUMENTS

| | | | |
|---|---|---|---|
| 3,580,657 | 5/1971 | Sheridon | 430/1 |
| 4,871,651 | 10/1989 | McCune, Jr. et al. | 430/324 |
| 5,024,726 | 6/1991 | Fujiwara | 156/653 |
| 5,225,039 | 7/1993 | Ohguri | 430/321 |

FOREIGN PATENT DOCUMENTS

| | | |
|---|---|---|
| 61-292923 | 12/1986 | Japan . |
| 61-292924 | 12/1986 | Japan . |
| 61-190368 | 1/1987 | Japan . |
| 1224767 | 9/1989 | Japan . |
| 4119629 | 4/1992 | Japan . |
| 3626715 | 8/1986 | United Kingdom . |
| 3837874 | 11/1988 | United Kingdom . |

OTHER PUBLICATIONS

"λ/4–Shifted In GaAsP/InP DFB Lasers", IEEE Journal of Quantum Electronics, vol. QE–22, No. 7, Jul. 1986, Utaka et al.

"λ/4 Shifted DFB-LD corrugation formed by a novel spatial phase modulating mask", Thesis of Society of Electronic Information Communication, vol. 85, No. 94, OQE85-60, pp. 57-64, Jul. 23, 1985.

Primary Examiner—Charles L. Bowers, Jr.
Assistant Examiner—Mark F. Huff
Attorney, Agent, or Firm—Leydig, Voit & Mayer

[57] ABSTRACT

In a method of producing a λ/4-shifted diffraction grating, a positive type photoresist is applied to a substrate so that the surface level of the photoresist is in the vicinity of the node of the nodes in a standing wave light intensity distribution in the thickness direction of the photoresist that is nearest to the substrate, the light intensity distribution is produced by interference between incident light in the film and light reflected by the substrate. Then, the photoresist is subjected to two-luminous-flux interference exposure, followed by development, providing a pattern of photoresist films regions each having an over-hanging portion. Thereafter, an insulating film is deposited on the photoresist and exposed parts of the substrate, a first protective resist is selectively formed on the photoresist, the insulating film which is not covered with the first resist is removed, the substrate is etched using the photoresist, which is not covered with the first resist, as a mask, the photoresist is removed together with the first resist and the insulating film on the photoresist by lift-off, leaving the insulating film on the substrate, a second protective resist is selectively formed on the etched surface of the substrate, and the substrate is etched using the insulating film on the substrate as a mask, whereby two regions of grooves in the substrate having reversed phase are produced.

4 Claims, 10 Drawing Sheets

METHOD OF PRODUCING DIFFRACTION GRATING

FIELD OF THE INVENTION

The present invention relates to a method of producing a λ/4-shifted diffraction grating.

BACKGROUND OF THE INVENTION

Optical fibers used in optical communications have wavelength dispersion characteristics in which the transmission speed varies according to the wavelength of light which is transmitted. Therefore, when lasers oscillating at a plurality of wavelengths are used as light sources, the signal waveforms unfavorably vary during the transmission.

As lasers used in the optical transmissions, DFB-LDs (Distributed Feedback Laser Diodes) having a diffraction grating in the vicinity of an active layer are known. FIG. 8 is a perspective view illustrating an example of the conventional DFB-LDs. In FIG. 8, reference numeral 1 denotes an n type semiconductor substrate. A diffraction grating 8 is formed on the n type semiconductor substrate 1. An n type waveguide layer 9, an active layer 10, a p type cladding layer 11, and a cap layer 12 are successively grown on the diffraction grating 8. A DFB laser thus produced achieves single mode oscillation.

When the diffraction grating is uniform in the DFB laser, however, the laser fundamentally oscillates in two longitudinal modes, and the intensity ratio of the two modes varies according to the phase of the diffraction grating at the laser facet. Therefore, whether a laser oscillating at a single wavelength is achieved or not becomes a matter of probability.

On the other hand, a DFB laser with a λ/4-shifted diffraction grating, in which the phase of the diffraction grating is shifted by λ/4 in the center of the laser resonator, stably oscillates at a single wavelength regardless of the phase of the diffraction grating at the laser facet.

Such a λ/4-shifted diffraction grating is usually formed by a two-luminous-flux interference exposure method.

The two-luminous-flux interference exposure method will be described with reference to FIG. 9.

In FIG. 9, laser light 14 is emitted from a light source, for example, an Ar laser 13. The laser light 14 is reflected by a mirror 15, expanded by a beam expander 16, and divided into two light fluxes by a beam splitter 17. The two light fluxes are reflected by movable mirrors 18 and strike a substrate 1 at an angle θ. At this time, interference fringes are generated on the substrate 1 due to the incident light, and a period cycle Λ of the interference fringe is defined by Λ=λ/2sinθ, where λ is a wavelength of the light source.

FIGS. 10(a)-10(k) are cross-sectional views schematically illustrating process steps in a method of producing the conventional λ/4-shifted diffraction grating. In the figures, a positive type photoresist 2, which is patterned into a form of a diffraction grating, is disposed on the substrate 1. The thickness of the photoresist 2 is below 100 nm and this is thinner than the height of a node relative to the substrate (about 120 nm) in the thickness direction, in the light intensity distribution generated in the photoresist used in the conventional production of the diffraction grating. Reference numeral 4 designates an SiNx film and reference numeral 3 designates a photoresist for protection. Reference numeral 5a designates a region where a diffraction grating, whose phase is opposite to the diffraction grating formed using the photoresist 2 as a mask, is produced. Reference numeral 5b designates a region where a diffraction grating, whose phase is the same as that of the diffraction grating formed using the photoresist 2 as a mask, is produced. Reference numeral 6 designates a phase shift region.

A description is given of the method of producing the λ/4-shifted diffraction grating.

Initially, a positive type photoresist is applied to the semiconductor substrate to a thickness below 100 nm. Then, the photoresist is exposed by the two-luminous-flux interference exposure, followed by development, resulting in the photoresist 2 patterned into the form of a diffraction grating (FIG. 10(a)). The pattern of diffraction grating has a period of about 0.2 micron.

Then, an SiNx film 4 about 30 nm thick is formed on the substrate 1 by chemical vapor deposition utilizing electron cyclotron resonance (hereinafter referred to as ECR-CVD) (FIG. 10(b)).

Then, a protective resist 3 is selectively formed on the SiNx film 4 in an opposite-phase region 5a, i.e., a region where a diffraction grating whose phase is opposite to the diffraction grating pattern of the photoresist 2 is produced (FIG. 10(c)). Then, using the protective resist 3 as a mask, the SiNx film 4 in a same-phase region 5b, i.e., a region where a diffraction grating whose phase is the same as the diffraction grating pattern of the photoresist 2 is produced, is selectively removed (figure 10(d)). Then, the substrate 1 is etched using the photoresist 2 patterned into the form of diffraction grating as a mask (FIG. 10(e)).

After removing the protective resist 3 (FIG. 10(f)), the SiNx film 4 on the photoresist 2 is selectively etched away with hydrofluoric acid, utilizing a characteristic that the etching rate of the SiNx film 4 on the photoresist 2 is higher than the etching rate of the SiNx film 4 on the substrate 1 (FIG. 10(g)). After the etching, the photoresist 2 is removed (FIG. 10(h)).

Then, a protective resist 3 is selectively formed on the substrate 1 in the same-phase region 5b (FIG. 10(i)). Then, the substrate 1 in the opposite-phase region 5a is etched using the SiNx film 4 which is formed in the step of FIG. 10(h) as a mask (FIG. 10(j)). Finally, the protective resist 3 and the SiNx film 4 are removed (figure 10(k)). In this way, a region 6 where a phase of the diffraction grating is shifted by π is produced.

In the conventional method of producing the λ/4-shifted diffraction grating, when the SiNx film 4 is formed on the photoresist 2 in the step of FIG. 10(b), the photoresist 2 is completely covered by the SiNx film 4, so that it is impossible to remove the photoresist 2 together with the SiNx film 4 disposed thereon by a lift-off technique. Therefore, as shown in FIGS. 10(f) and 10(g), the SiNx film 4 on the photoresist 2 is selectively removed by etching utilizing a difference in etching rates between the SiNx on the photoresist 2 and the SiNx on the substrate 1, whereby the reversal of the phase is achieved.

The conventional method of producing the λ/4-shifted diffraction grating requires a lot of process steps, i.e., several resist applying steps, photolithographic steps, etching steps, film forming steps, and the like as illustrated in FIGS. 10(a)-10(k), which cause the disadvantage that the production process is complicated. In addition, since the difference in the etching rates between the SiNx on the photoresist 2 and the SiNx on the substrate 1 is utilized when the SiNx on the photoresist 2 is selectively removed, the production process is unstable.

Meanwhile, Japanese Published Patent Application No. 124767 discloses another method of producing a λ/4-shifted diffraction grating. In this method, a positive type photoresist capable of image reversal is applied to a substrate and a light shielding plate is formed on a prescribed portion of the photoresist. Then, the photoresist with the light shielding plate is subjected to two-luminous-flux interference exposure and reversal baking. Then, the light shielding plate is removed and the photoresist is subjected to two-luminous-flux interference exposure again, resulting in a diffraction grating in which the phase is shifted by λ/4 with the light shielding plate as a boundary. In this method, however, the step of reversal baking complicates the production process.

Japanese Published Patent Application No. 61-292923 discloses still another method of producing a λ/4-shifted diffraction grating. In this method, a photoresist obtained by mixing a positive type photoresist with a negative type photoresist is applied to a substrate, and a material that suppresses radiation sensitivity is implanted into a prescribed region of the photoresist. Then, the photoresist is subjected to two-luminous-flux interference exposure, resulting in a diffraction grating in which the phase is shifted by λ/4 with the implanted region as a boundary. In this method, however, the step of implanting the material that suppresses radiation sensitivity complicates the production process.

SUMMARY OF THE INVENTION

It is an object of the present invention to provide a method of producing a λ/4-shifted diffraction grating that reduces the number of process steps and that ensures stable production.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, a method of producing a λ/4-shifted diffraction grating comprises the steps of applying a positive type photoresist on a substrate such that the surface level of the photoresist is positioned in the vicinity of a node nearest to the substrate among the nodes of the light intensity distribution in the thickness direction of the photoresist, which light intensity distribution is produced by interference between light reflected by the substrate and incident light; exposing the positive type photoresist by the two-luminous-flux interference exposure method; developing the positive type photoresist to form a pattern of the photoresist comprising a plurality of photoresist films each having an over-hanging portion; depositing an insulating film on the photoresist pattern; selectively forming a first protective resist on the photoresist pattern; removing a portion of the insulating film which is not covered with the first protective resist; etching the substrate using the photoresist pattern as a mask, which photoresist pattern is not covered with the first protective resist; removing the photoresist pattern together with the first protective resist and the insulating film on the photoresist pattern by lift-off, leaving the insulating film on the substrate; selectively forming a second protective resist on the etched surface of the substrate; and etching the substrate using the insulating film on the substrate as a mask, whereby a region whose phase is reversed with respect to the region covered with the second protective resist is produced. Therefore, the etching step utilizing a difference in etching rates between the insulating film on the photoresist and the insulating film on the substrate is dispensed with, whereby the number of process steps is reduced and the λ/4-shifted diffraction grating is produced in reliable process steps.

According to a second aspect of the present invention, a method of producing a λ/4-shifted diffraction grating comprises the steps of applying a positive type photoresist to a substrate such that the surface level of the photoresist is positioned in the vicinity of a node nearest to the substrate among the nodes of a light intensity distribution in the thickness direction of the photoresist, which light intensity distribution is produced by interference between light reflected by the substrate and incident light; exposing the positive type photoresist by the two-luminous-flux interference exposure method; developing the positive type photoresist to form a pattern of the photoresist comprising a plurality of photoresist films each having an over-hanging portion; depositing an insulating film on a portion of the photoresist pattern while the other portion of the photoresist pattern is masked; forming a first protective resist on the photoresist pattern on which the insulating film is present; etching the surface of the substrate using the photoresist pattern as a mask, which photoresist pattern is not covered with the first protective resist; removing the photoresist pattern together with the first protective resist and the insulating film on the photoresist pattern by lift-off, leaving the insulating film on the substrate; selectively forming a second protective resist on the etched surface of the substrate; and etching the surface of the substrate using the insulating film remaining on the substrate as a mask, whereby a region where a phase is reversed with respect to the region covered with the second protective resist is produced. Therefore, the etching step utilizing a difference in etching rates between the insulating film on the photoresist and the insulating film on the substrate is dispensed with, whereby the number of process steps is reduced and the λ/4-shifted diffraction grating is produced in reliable process steps. Furthermore, the step of removing the insulating film which is not covered with the first protective resist in the method according to the first aspect of the present invention is dispensed with, whereby the number of process steps is further decreased.

In the above-described methods of producing a λ/4-shifted diffraction grating, a negative type photoresist is employed and the thickness of the negative type photoresist is chosen such that the surface level of the photoresist is in the vicinity of an antinode nearest to the substrate in a light intensity distribution in the thickness direction of the photoresist, which light intensity distribution is produced by interference between light reflected by the substrate and incident light.

DETAILED DESCRIPTION OF THE PREFERRED EMBODIMENTS

Figure 1A:
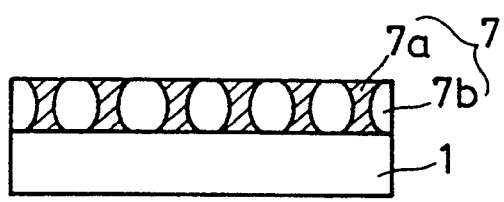
FIGS. 1(a)–1(i) are cross-sectional views illustrating process steps in a method of producing a λ/4-shifted diffraction grating in accordance with a first embodiment of the present invention.

FIGS. 1(a)–1(i) are cross-sectional views illustrating process steps in a method of producing a λ/4-shifted diffraction grating in accordance with a first embodiment of the present invention. In the figures, the same reference numerals as in FIGS. 10(a)–10(k) designate the same or corresponding parts. Reference numeral 7 designates a positive type photoresist and numerals 7a and 7b designate unexposed portions and exposed portions of the positive type photoresist 7, respectively. The thickness of the positive type photoresist is chosen so that the surface level of the photoresist is in the vicinity of a node of a standing wave light intensity distribution in the photoresist, which light intensity distribution is produced by an interference caused by light reflected by the substrate and incident light. Preferably, the thickness is in a range of 120 nm±20 nm. For example, MICROPOSIT 1400 of Shipley Co. Ltd. is used as the positive type photoresist.

Initially, a positive type photoresist 7 is applied to the substrate 1 such that the surface level thereof is positioned in the vicinity of a node of a standing wave light intensity distribution within the photoresist. That node is chosen from the nodes of the light intensity distribution in the thickness direction which is generated in the photoresist 7 at the time of exposure, to be the node that is closes to the substrate. The photoresist 7 is subjected to a pre-baking (figure 1(a)). Then, the photoresist 7 is exposed by the two-luminous-flux interference exposure method, followed by development. Since the surface of the photoresist 7 is in the vicinity of a node of the standing wave, refractory layers are formed in the surface region of the photoresist 7, whereby the photoresist 7 is patterned into the form in which a plurality of photoresist film regions 7a each having an overhanging portion are arranged at periods of about 0.2 micron (figure 1(b)).

Figure 1B:
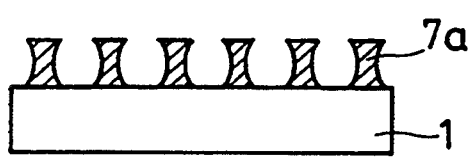
Figure 1C:
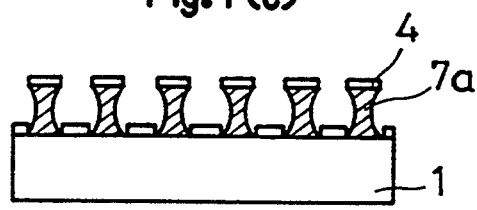

The method of forming the photoresist pattern shown in figure 1(b) will be described in more detail with reference to FIGS. 2 and 3(a)–3(b).

Figure 2:
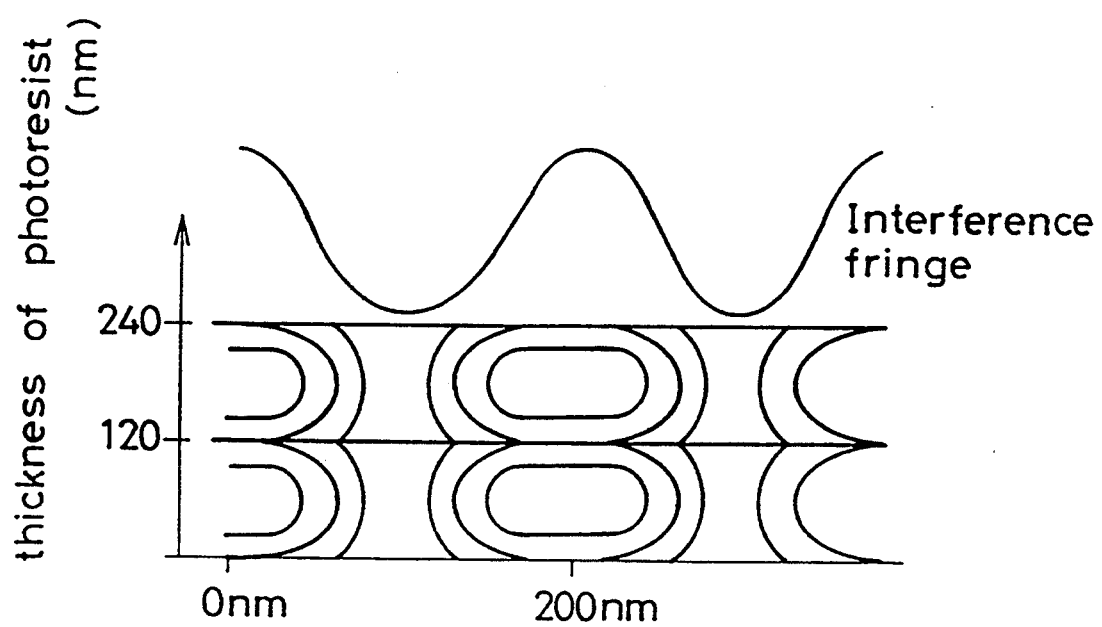
FIG. 2 is a diagram illustrating a light intensity distribution in a photoresist.
Figure 3A:
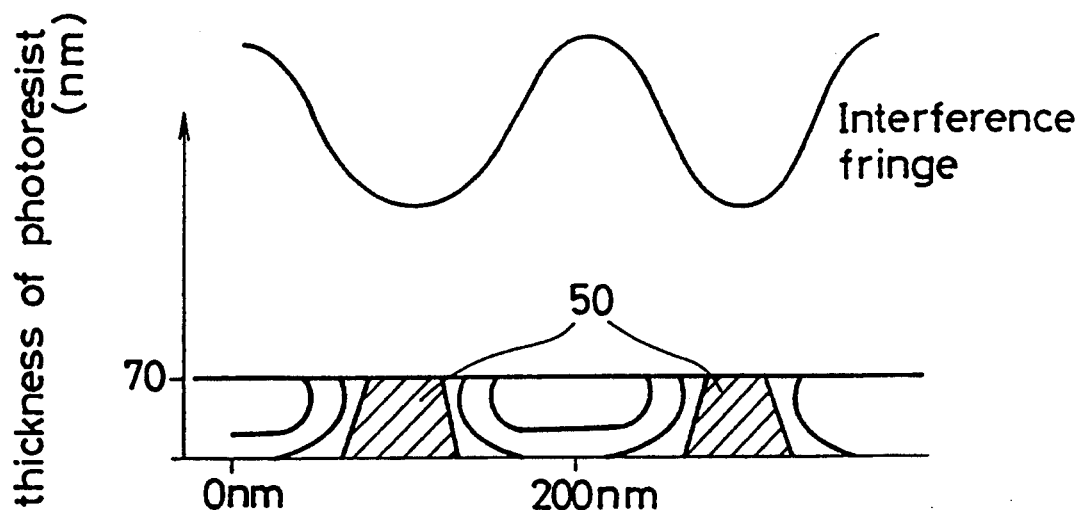
FIGS. 3(a) and 3(b) are diagrams for explaining a formation of a pattern of a positive type photoresist utilizing a light intensity distribution in the positive type photoresist in accordance with the first embodiment of the present invention.

FIG. 2 is a schematic diagram illustrating the light intensity distribution in the photoresist in a case where the photoresist on the substrate is exposed by the two-luminous-flux interference exposure method using an Ar laser (351.1 nm) as a light source so that interference fringes are formed with periods of about 0.2 micron. When a photoresist is exposed by the two-luminous-flux interference exposure method, a single wavelength gas laser having a high coherence, such as an Ar laser (351.1 nm, 363.8 nm), a He-Cd laser (325 nm), or the like is used as the light source. When the exposure is carried out by the two-luminous-flux interference exposure method using such a laser, the light intensity distribution caused by interference fringes from the interference of the two luminous fluxes overlaps with the light intensity distribution of a standing wave in the thickness direction of the photoresist caused by interference of incident light and light reflected by the substrate as shown in FIG. 2. The thickness of the photoresist conventionally used in the two-luminous-flux interference exposure method is 50 to 100 nm. When a photoresist having such a thickness is used, regions where the intensity of light is increased are present in the vicinity of the surface of the photoresist as shown in FIG. 3(a). In addition, since a positive type photoresist is used, portions of the photoresist irradiated by light are dissolved during development and hatched portions 50 are left. In this case, a pattern having an over-hanging portion, i.e., a pattern whose upper end portion is wider than a lower portion, is not achieved. In addition, since the exposure is carried out using the interference fringes generated by the two-luminous-flux interference, it is difficult to produce a photoresist pattern with a good contrast, so that only a triangular or trapezoid pattern is obtained.

Figure 3B:
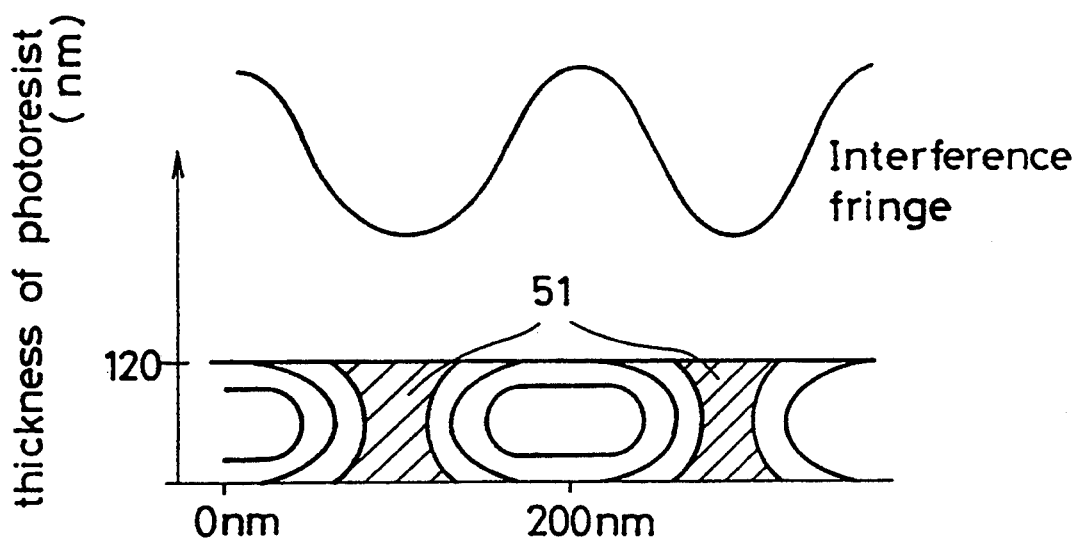

On the other hand, in FIG. 3(b), the thickness of the photoresist is chosen so that the surface level of the photoresist is in the vicinity of a node in the light intensity distribution, i.e., a region where the intensity of light is low. For example, it is in a range of 120±20 nm. In this case, since regions where the intensity of light is decreased are present in the vicinity of the surface of the photoresist, the surface of the photoresist is refractory, i.e., difficult to dissolve in a solvent. On the contrary, regions where the intensity of light is increased are present inside the photoresist, so that the inside of the photoresist is easily dissolved. Therefore, hatched portions 51 are left, resulting in a pattern comprising a plurality of photoresist films each having an over-hanging portion.

After the photoresist film regions 7a (hereinafter referred to simply as photoresist 7a) are formed on the substrate 1, the photoresist 7a is subjected to a post-baking. This post-baking is necessary only in a case where the photoresist 7a would be mixed with a protective resist 3 which is disposed thereon. Therefore, when a photoresist which does not cause such a mixing is employed, the post-baking is not required. If the photoresist 7a is not subjected to post-baking, the subsequent lift-off step will be favorably carried out. Thereafter, an SiNx film is directionally deposited on the substrate 1 and the photoresist 7a by ECR-CVD (figure 1(c)). Since each photoresist film 7a has an overhanging portion, the SiNx 4 deposited on the substrate 1 is discontinuous from the SiNx 4 deposited on the photoresist 7a.

Figure 1D:
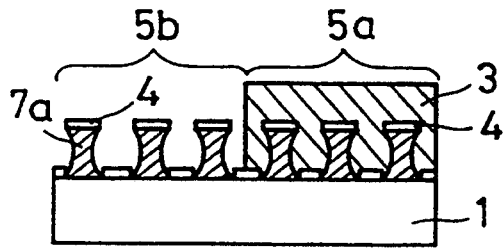
Figure 1E:
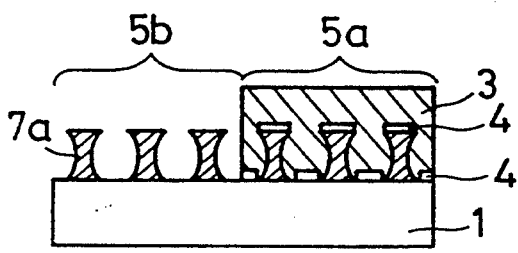

Then, a first protective resist 3 is formed in an opposite-phase region 5a, i.e., a region where a diffraction grating whose phase is opposite to the diffraction grating pattern of the photoresist 7a is to be produced (figure 1(d)). Using the first protective resist 3 as a mask, the SiNx 4 in a same-phase region 5b, i.e., a region where a diffraction grating whose phase is the same as the diffraction grating pattern of the photoresist 7a is to be produced, is removed (figure 1(e)).

Figure 1F:
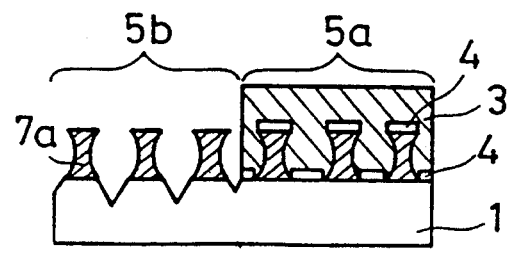
Figure 1G:
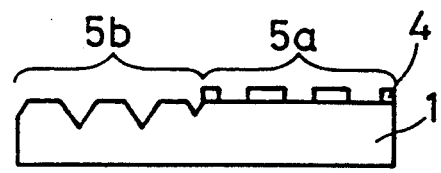

Then, the substrate 1 in the same-phase region 5b is etched (figure 1(f)). Then, the photoresist 7a is removed by a prescribed etchant, whereby the SiNx 4 on the photoresist 7a and the first protective resist 3 are removed by lift-off, leaving the SiNx 4 on the substrate 1 in the opposite-phase region 5a (figure 1(g)).

Figure 1H:
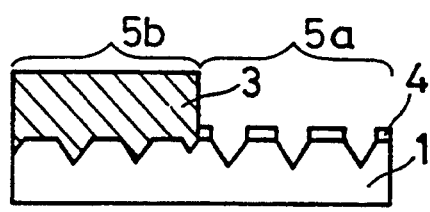
Figure 1I:
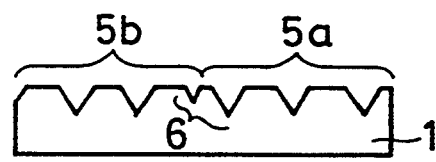

Then, the substrate in the same-phase region 5b is covered by a second protective resist 3, and the substrate in the opposite-phase region 5a is etched using the SiNx 4 as a mask (figure 1(h)). Finally, the second protective resist 3 and the SiNx 4 are removed (figure 1(i)). In this way, a diffraction grating having a region 6 where the period of the diffraction grating is shifted by $\pi$ is achieved.

In the first embodiment of the present invention, utilizing the over-hanging photoresist, the insulating film disposed on the substrate is discontinuous from the insulating film disposed on the photoresist, and only the insulating film on the substrate is left after a lift-off step. Therefore, the etching step utilizing a difference in etching rates between the insulating film on the photoresist and the insulating film on the substrate can be dispensed with, whereby the number of process steps is reduced and the diffraction grating is produced in reliable process steps.

FIGS. 4(a) to 4(h) are cross-sectional views illustrating process steps in a method of producing a λ/4-shifted diffraction grating in accordance with a second embodiment of the present invention. In the figures, reference numeral 8 designates a mask. The same reference numerals as those in FIGS. 1(a)–1(i) designate the same parts.

Initially, a positive type photoresist 7 is applied onto the substrate 1. The thickness of the photoresist 7 is chosen such that the surface level of the photoresist is positioned in the vicinity of a node in a light intensity distribution generated in the photoresist when the photoresist is exposed. Then, the photoresist 7 is subjected to a pre-baking (FIG. 4(a)). Then, the photoresist 7 is exposed by the two-luminous-flux interference exposure method, followed by development. At this time, since the surface of the photoresist 7 is in the vicinity of the node of the standing wave, refractory layers are formed in the surface region of the photoresist 7, whereby the photoresist 7 is patterned in the form in which a plurality of photoresist film regions 7a each having an overhanging portion are arranged at periods of about 0.2 micron (FIG. 4(a)). Then, the photoresist 7a is subjected to a post-baking. The post-baking has the same merits and demerits as described in the first embodiment of the present invention. Subsequently, the same-phase region 5b is covered with a mask 8 (FIG. 4(b)), and an SiNx film 4 is directionally deposited thereon by ECR-CVD (FIG. 4(c)). At this time, since each photoresist film 7a has an over-hanging portion, the SiNx 4 grown on the substrate 1 is discontinuous from the SiNx 4 grown on the photoresist 7a.

Figure 4A:
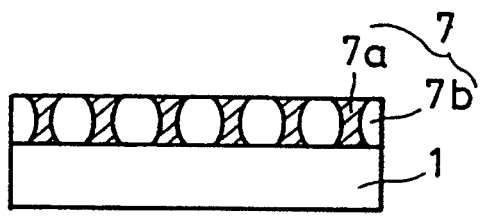
FIGS. 4(a)–4(h) are cross-sectional views illustrating process steps in a method of producing a λ/4-shifted diffraction grating in accordance with a second embodiment of the present invention.
Figure 4B:
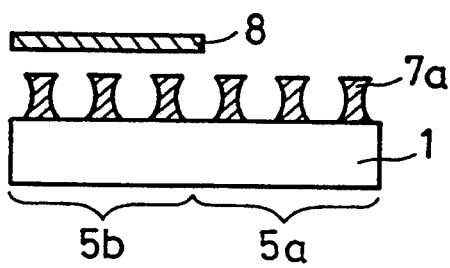
Figure 4C:
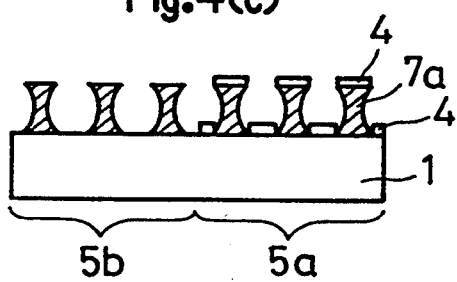
Figure 4D:
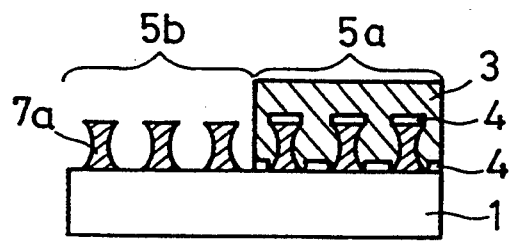
Figure 4E:
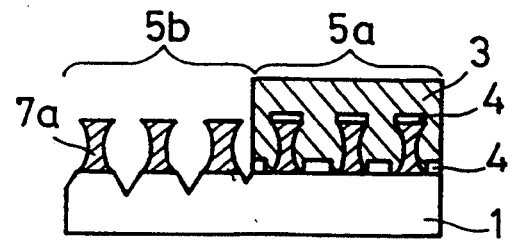
Figure 4F:
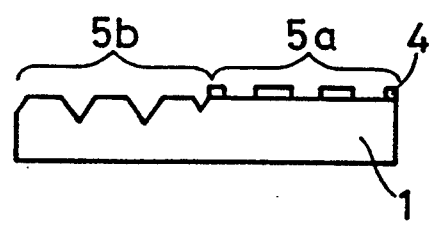

Then, a first protective resist 3 is formed only in the opposite-phase region 5a (FIG. 4(d)). Then, using the photoresist 7a as a mask, the substrate 1 in the same-phase region 5b is etched (FIG. 4(e)). Thereafter, the photoresist 7a is removed by a prescribed etchant, whereby the SiNx 4 on the photoresist 7a and the first protective resist 3 are removed by lift-off, leaving the SiNx 4 on the substrate in the opposite-phase region 5a (FIG. 4(f)).

Figure 4G:
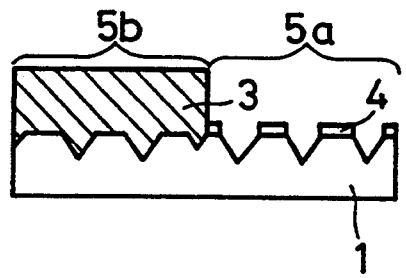
Figure 4H:
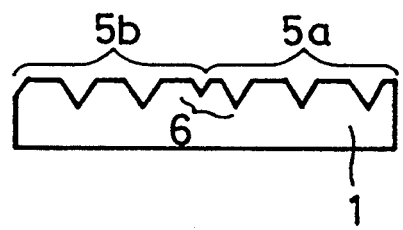

Then, the substrate in the same-phase region 5b is covered with a second protective resist 3 and the substrate in the opposite-phase region 5a is etched using the SiNx 4 as a mask (FIG. 4(g)). Finally, the second protective resist 3 and the SiNx 4 are removed (FIG. 4(h)). In this way, a diffraction grating having a region 6 where the period of the diffraction grating is shifted by $\pi$ is achieved.

In the second embodiment of the present invention, since the insulating film 4 is formed using the mask 8, the step of removing the insulating film 4 in the same-phase region 5b is dispensed with, whereby the number of process steps is further decreased as compared with the first embodiment and the diffraction grating is produced in reliable process steps.

While in the above-described first and second embodiments the SiNx film 4 serving as a mask for the phase reversal is formed by ECR-CVD, the SiNx film may be formed by other methods so long as the method is directional. In addition, an SiO film, an SiON film, or the like, which adheres well to the substrate, may be used in place of the SiNx film. These films are completely removed by lift-off when hydrofluoric acid or a solution comprising ammonium fluoride and hydrofluoric acid is used as an etchant.

Figure 5:
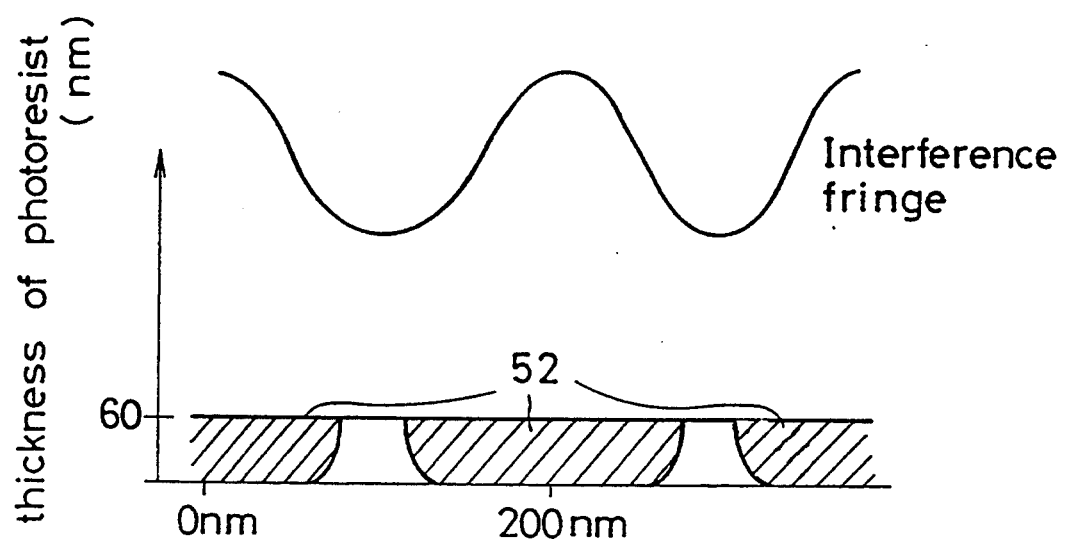
FIG. 5 is a diagram for explaining a formation of a pattern of a negative type photoresist utilizing a light intensity distribution in the negative type photoresist in accordance with a third embodiment of the present invention.

While in the above-described first and second embodiments the positive type photoresist is employed, a negative type photoresist, in which a portion not irradiated with light is dissolved during the development, may be employed. In this case, as shown in FIG. 5, the thickness of the negative photoresist is chosen so that the surface level of the photoresist is in the vicinity of an antinode, i.e., a region where the intensity of light is maximum, in the standing wave light intensity distribution. For example, it is in a range of 60±10 nm. In this case, since regions where the intensity of light is increased are present in the vicinity of the surface of the photoresist, the surface of the photoresist is refractory. On the contrary, since regions where the intensity of light is decreased are present inside the photoresist, the inside of the photoresist is easily dissolved. Therefore, hatched portions 52 are not dissolved during development, resulting in a pattern comprising a plurality of photoresist films each having an over-hanging portion.

FIGS. 6(a)–6(i) are cross-sectional views illustrating process steps in a method for producing a λ/4-shifted diffraction grating in accordance with a third embodiment of the present invention. In the figures, reference numeral 20 designates a negative photoresist and numerals 20a and 20b designate unexposed portions and exposed portions of the negative type photoresist 20, respectively. The same reference numerals as in FIGS. 1(a)–1(i) designate the same parts.

Figure 6A:
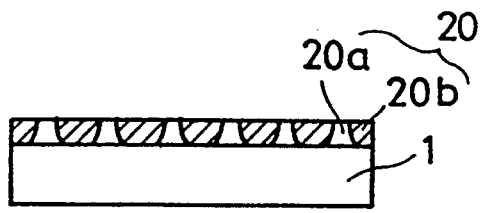
FIGS. 6(a)–6(i) are cross-sectional views illustrating process steps in a method of producing a λ/4-shifted diffraction grating in accordance with the third embodiment of the present invention.
Figure 6B:
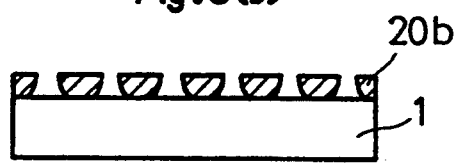
Figure 6C:
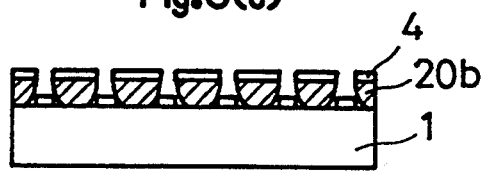
Figure 6D:
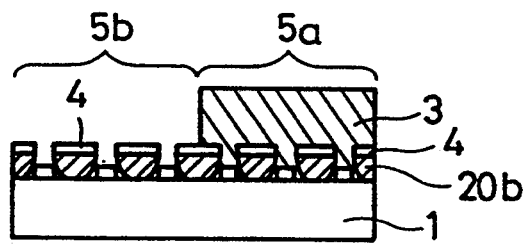
Figure 6E:
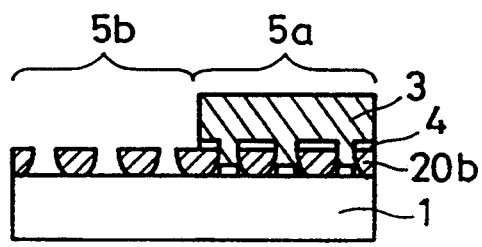
Figure 6F:
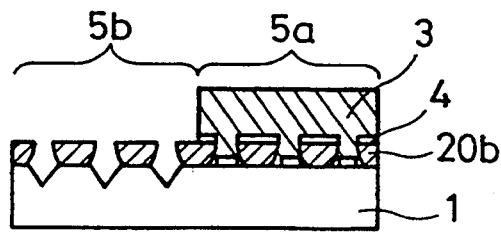
Figure 6G:
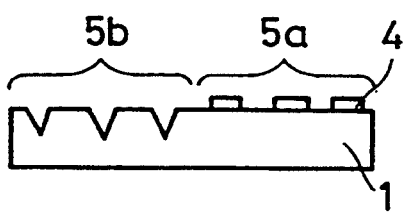
Figure 6H:
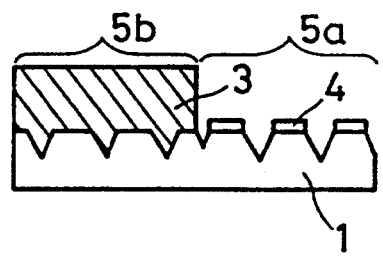
Figure 6I:
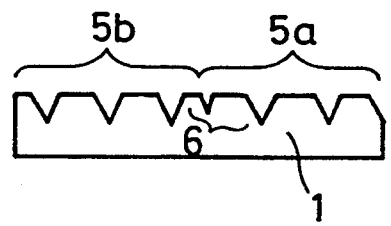
Figure 7A:
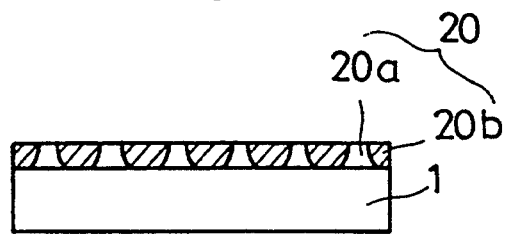
FIGS. 7(a)–7(h) are cross-sectional views illustrating process steps in a method of producing a λ/4-shifted diffraction grating in accordance with a fourth embodiment of the present invention.
Figure 7E:
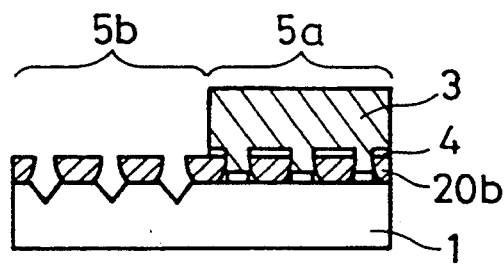
Figure 7B:
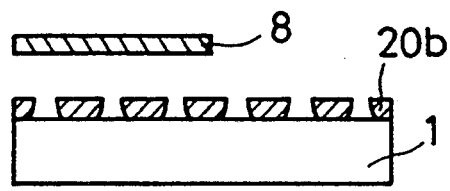
Figure 7F:
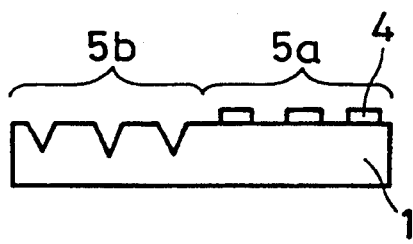
Figure 7C:
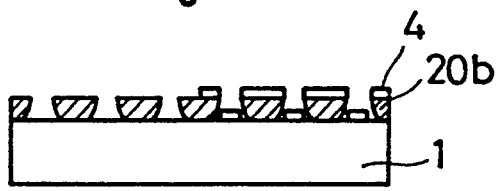
Figure 7G:
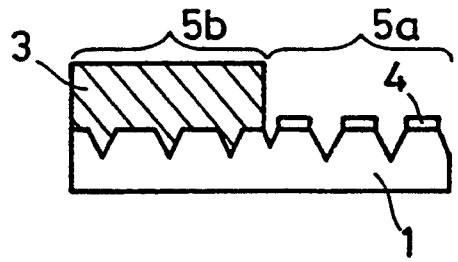
Figure 7D:
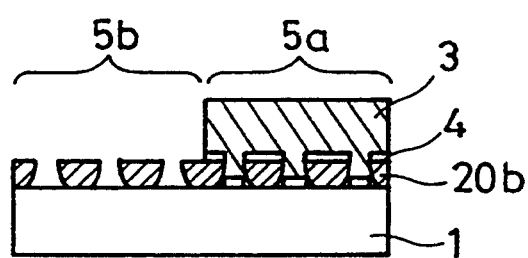
Figure 7H:
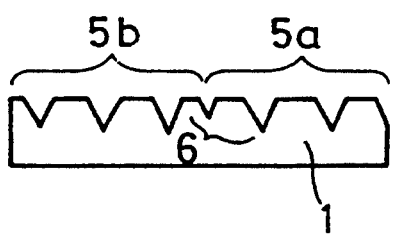
Figure 8:
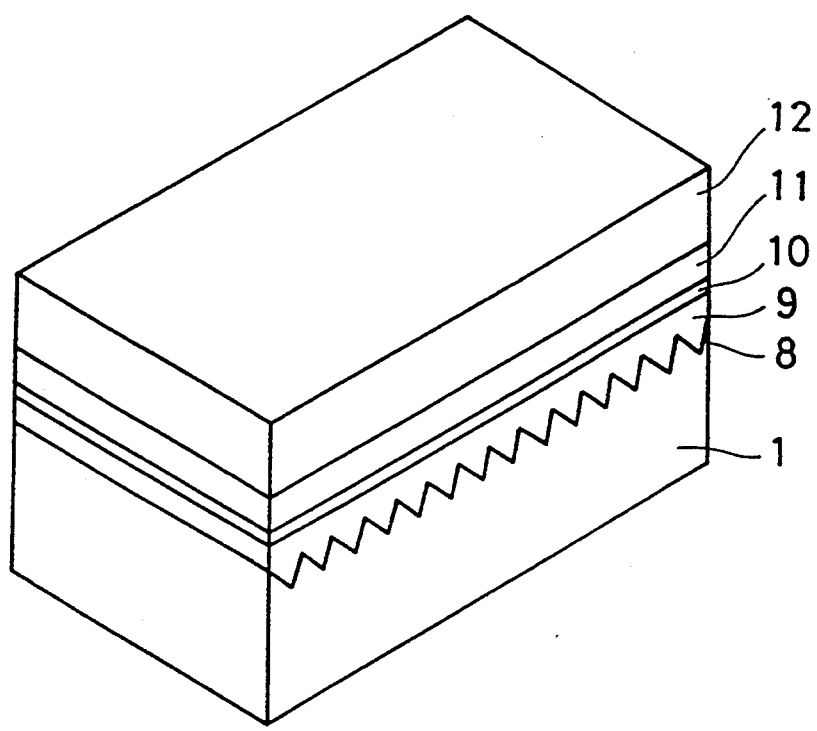
FIG. 8 is a perspective view illustrating a DFB-LD in accordance with the prior art.
Figure 9:
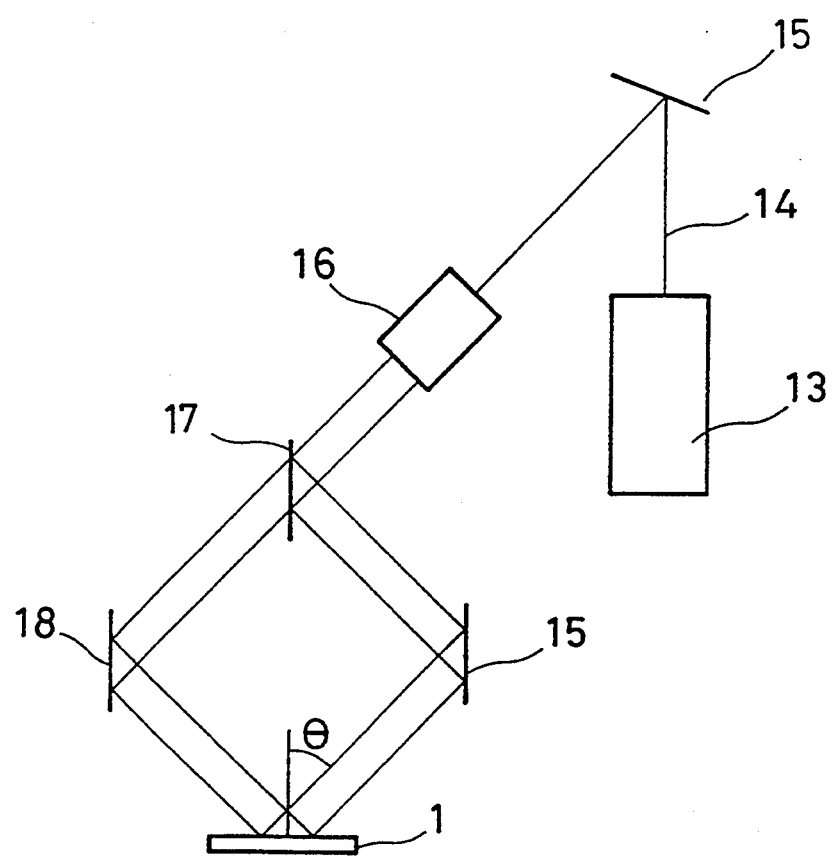
FIG. 9 is a schematic diagram for explaining a two-luminous-flux interference exposure method in accordance with the prior art.
Figure 10A:
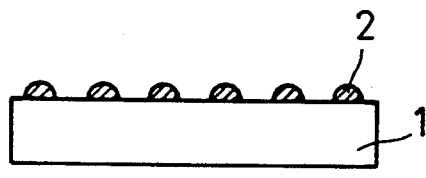
FIGS. 10(a)–10(k) are cross-sectional views illustrating process steps in a method of producing a λ/4-shifted diffraction grating in accordance with the prior art.
Figure 10B:
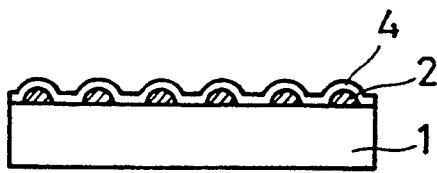
Figure 10C:
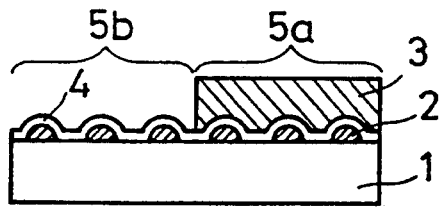
Figure 10D:
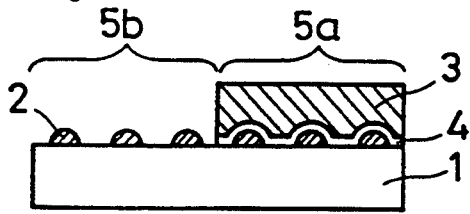
Figure 10E:
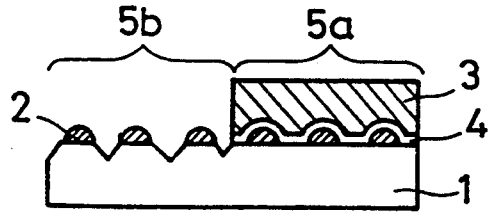
Figure 10F:
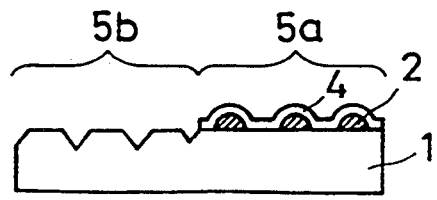
Figure 10G:
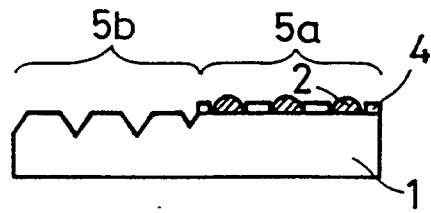
Figure 10H:
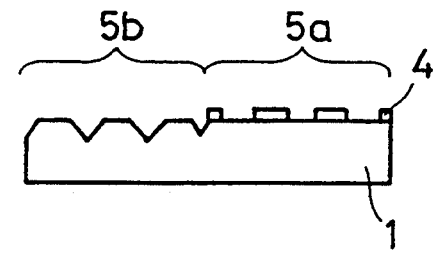
Figure 10I:
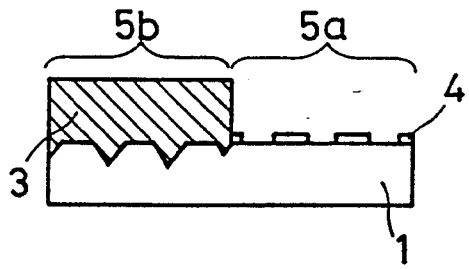
Figure 10J:
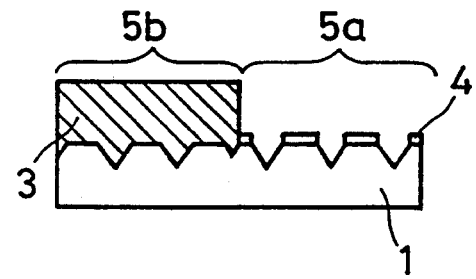
Figure 10K:
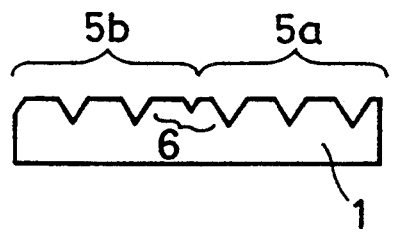

In production, the negative type photoresist 20 is applied to the substrate 1. The thickness of the photoresist 20 is chosen so that the surface level of the photoresist is in the vicinity of the antinode in the light intensity distribution. For example, it is in a range of about 60±10 nm. Then, the photoresist is subjected to two-luminous-flux interference exposure, followed by development, resulting in a pattern comprising a plurality of photoresist film regions 20b each having an over-hanging portion. Through the same process steps as those described in the first embodiment, a λ/4-shifted diffraction grating shown in FIG. 6(i) is achieved. Also in this third embodiment, the same effects as described in the first embodiment are obtained.

FIGS. 7(a)–7(h) are cross-sectional views illustrating process steps in a method for producing a λ/4-shifted diffraction grating in accordance with a fourth embodiment of the present invention. In the figures, the same reference numerals as in FIGS. 4(a)–4(h) and 6(a)–6(i) designate the same parts.

This fourth embodiment is different from the second embodiment only in that a negative photoresist 20 is employed and the thickness thereof is chosen so that the surface level of the photoresist is in the vicinity of the antinode in the light intensity distribution, for example, in a range of 60±10 nm. Steps illustrated in FIGS. 7(b) to 7(h) are identical to those already described with respect to FIGS. 4(b) to 4(h) and, therefore, do not required repeated description. In this fourth embodiment, the same effects as described in the second embodiment are achieved.

As is evident from the foregoing description, according to the present invention, in a method of producing a λ/4-shifted diffraction grating, a positive type photoresist is applied to a substrate such that the surface level of the photoresist is positioned in the vicinity of the node nearest to the substrate, of the nodes in a light intensity distribution in the thickness direction of the photoresist, the light intensity distribution being produced by interference between light reflected by the substrate and incident light. Or, a negative type photoresist is applied to the substrate so that the surface level of the photoresist is in the vicinity of the antinode nearest to the substrate of the antinodes a light intensity distribution in the thickness direction of the photoresist. Then, the photoresist is exposed by the two-luminous-flux interference exposure method, followed by development, providing a pattern of the photoresist comprising a plurality of photoresist films each having an over-hanging portion. Thereafter, an insulating film is deposited on the photoresist pattern, a first protective resist is selectively formed on the photoresist pattern, a portion of the insulating film which is not covered with the first protective resist is removed, the substrate is etched using the photoresist pattern which is not covered with the first protective resist as a mask, the photoresist pattern is removed together with the first protective resist and the insulating film on the photoresist pattern by lift-off, leaving the insulating film on the substrate, a second protective resist is selectively formed on the etched surface of the substrate, and the substrate is etched using the insulating film remaining on the substrate as a mask, whereby a region whose phase is reversed with respect to the region covered with the second protective resist is produced. Therefore, an etching step utilizing a difference in etching rates between the insulating film on the photoresist and the insulating film on the substrate is dispensed with, whereby the number of process steps is reduced and the λ/4-shifted diffraction grating is produced reliable process steps.

In addition, in a method of producing a λ/4-shifted diffraction grating, a positive type photoresist is applied to a substrate such that the surface level of the photoresist is positioned in the vicinity of the node nearest to the substrate of the nodes of a light intensity distribution in the thickness direction of the photoresist, the light intensity distribution being produced by interference between light reflected by the substrate and incident light. Or, a negative type photoresist is applied to the substrate so that the surface level of the photoresist is in the vicinity of antinode nearest to the substrate of the antinodes is a light intensity distribution in the thickness direction of the photoresist. Then, the photoresist is exposed by a two-luminous-flux interference exposure method, followed by development, providing a pattern of photoresist comprising a plurality of photoresist films each having an over-hanging portion. Thereafter, an insulating film is deposited on a portion of the photoresist pattern while the other portion of the photoresist pattern is masked, a first protective resist is formed on the photoresist pattern on which the insulating film is present, the surface of the substrate is etched using the photoresist pattern which is not covered with the first protective resist as a mask, the photoresist pattern is removed together with the first protective resist and the insulating film on the photoresist pattern by lift-off, leaving the insulating film on the substrate, a second protective resist is selectively formed on the etched surface of the substrate, and the surface of the substrate is etched using the insulating film remaining on the substrate as a mask, whereby region where a phase is reversed with respect to the region covered with the second protective resist is produced. Therefore, an etching step utilizing a difference in etching rates between the insulating film on the photoresist and the insulating film on the substrate is dispensed with, whereby the number of process steps is reduced and the λ/4-shifted diffraction grating is produced in reliable process steps.

What is claimed is:

1. A method of producing a λ/4-shifted diffraction grating utilizing a two-luminous-flux interference exposure method comprising:

applying a positive type photoresist to a substrate in a thickness such that the surface of the photoresist is positioned in the vicinity of the node of the nodes of a standing wave light intensity distribution in the thickness direction of the photoresist that is nearest the substrate, the standing wave light intensity distribution being produced by interference between light incident on the photoresist and light within the photoresist that is reflected by the substrate;

exposing said positive type photoresist, with an interference pattern produced by two interfering light beams;

developing said positive type photoresist to form a pattern of said photoresist comprising a plurality of photoresist film regions each region having an over-hanging portion wherein the substrate is exposed between the regions;

depositing an insulating film on the photoresist pattern and on the exposed substrate;

forming a first protective resist on a portion of the photoresist pattern;

removing the portion of said insulating film that is not covered by the first protective resist;

etching a portion of the substrate using the portion of the photoresist pattern that is not covered by the first protective resist as a mask to form a periodic pattern of grooves in a first portion of the substrate;

removing the photoresist pattern together with the first protective resist and the insulating film on the photoresist pattern by lift-off, leaving the insulating film on the substrate;

selectively forming a second protective resist on the etched portion of the substrate; and etching a portion of the substrate using the insulating film on the substrate as a mask, thereby forming a periodic pattern of grooves in a second portion of the substrate having a phase that is reversed with respect to the periodic pattern of grooves in the first portion of the substrate, the first portion being covered by the second protective resist.

2. A method of producing a $\lambda/4$-shifted diffraction grating utilizing a two-luminous-flux interference exposure method comprising:

applying a positive type photoresist to a substrate in a thickness such that the surface of the photoresist is positioned in the vicinity of the node of the nodes of a standing wave light intensity distribution in the thickness direction of the photoresist that is nearest the substrate, the standing wave light intensity distribution being produced by interference between light incident on the photoresist and light within the photoresist that is reflected by the substrate;

exposing said positive type photoresist, with an interference pattern produced by two interfering light beams;

developing said positive type photoresist to form a pattern of said photoresist comprising a plurality of photoresist film regions each region having an over-hanging portion wherein the substrate is exposed between the regions;

depositing an insulating film on a first portion of the photoresist pattern and on the exposed substrate at the first portion of the photoresist pattern while a second portion of the photoresist pattern is masked;

forming a first protective resist on the photoresist pattern and the substrate on which the insulating film is present;

etching the second portion of the substrate using the photoresist pattern not covered by the first protective resist as a mask to form a periodic pattern of grooves in the second portion of the substrate;

removing the photoresist pattern together with the first protective resist and the insulating film on the photoresist pattern by lift-off, leaving the insulating film on the first portion of substrate;

selectively forming a second protective resist on the etched, second portion of the substrate; and etching the first portion of the substrate using the insulating film remaining on the substrate as a mask, thereby forming a periodic pattern of grooves in the first portion of the substrate having a phase that is reversed with respect to the periodic pattern of grooves in the second portion of the substrate, the second portion being covered with the second protective resist.

3. A method of producing a $\lambda/4$-shifted diffraction grating utilizing a two-luminous-flux interference exposure method comprising:

applying a negative type photoresist to a substrate in a thickness such that the surface of the photoresist is positioned in the vicinity of the antinode of the antinodes of a standing wave light intensity distribution in the thickness direction of the photoresist that is nearest the substrate, the standing wave light intensity distribution being produced by interference between light incident on the photoresist and light within the photoresist reflected by the substrate;

exposing said negative type photoresist, with an interference pattern produced by two interfering light beams;

developing said negative type photoresist to form a pattern of said photoresist comprising a plurality of photoresist film regions each region having an over-hanging portion wherein the substrate is exposed between the regions;

depositing an insulating film on the photoresist pattern and on the exposed substrate;

forming a first protective resist on a portion of the photoresist pattern;

removing the portion of said insulating film that is not covered by the first protective resist;

etching a portion of the substrate using the portion of the photoresist pattern that is not covered by the first protective resist as a mask to form a periodic pattern of grooves in a first portion of the substrate;

removing the photoresist pattern together with the first protective resist and the insulating film on the photoresist pattern by lift-off, leaving the insulating film on the substrate;

selectively forming a second protective resist on the etched portion of the substrate; and etching a portion of the substrate using the insulating film on the substrate as a mask, thereby forming a periodic pattern of grooves in a second portion of the substrate having a phase that is reversed with respect to the periodic pattern of grooves in the first portion of the substrate, the first portion being covered by the second protective resist.

4. A method of producing a $\lambda/4$-shifted diffraction grating utilizing a two-luminous-flux interference exposure method comprising:

applying a negative type photoresist to a substrate in a thickness such that the surface of the photoresist is positioned in the vicinity of the antinode of the antinodes of a standing wave light intensity distribution in the thickness direction of the photoresist that is nearest the substrate, the standing wave light intensity distribution being produced by interference between light incident on the photoresist and light within the photoresist reflected by the substrate;

exposing said negative type photoresist, with an interference pattern produced by two interfering light beams;

developing said negative type photoresist to form a pattern of said photoresist comprising a plurality of photoresist film regions each region having an over-hanging portion wherein the substrate is exposed between the regions;

depositing an insulating film on a first portion of the photoresist pattern and on the exposed substrate at the first portion of the photoresist pattern while a second portion of the photoresist pattern is masked;

forming a first protective resist on the photoresist pattern and the substrate on which the insulating film is present;

etching the second portion of the substrate using the photoresist pattern not covered by the first protective resist as a mask to form a periodic pattern of grooves in the second portion of the substrate;

removing the photoresist pattern together with the first protective resist and the insulating film on the photoresist pattern by lift-off, leaving the insulating film on the first portion of substrate;

selectively forming a second protective resist on the etched, second portion of the substrate; and etching the first portion of the substrate using the insulating film remaining on the substrate as a mask, thereby forming a periodic pattern of grooves in the first portion of the substrate having a phase that is reversed with respect to the periodic pattern of grooves in the second portion of the substrate, the second portion being covered with the second protective resist.

* * * * *